United States Patent

[11] 3,560,813

[72] Inventor William S. Phy
Los Altos, Calif.
[21] Appl. No. 807,633
[22] Filed Mar. 13, 1969
[45] Patented Feb. 2, 1971
[73] Assignee Fairchild Camera and Instrument Corporation
Syosset, Long Island, N.Y.
a corporation of Delaware

[54] HYBRIDIZED MONOLITHIC ARRAY PACKAGE
10 Claims, 3 Drawing Figs.

[52] U.S. Cl. .......... 317/234, 29/576
[51] Int. Cl. .......... H01l 1/16
[50] Field of Search .......... 317/234, 235, 237—241, 101

[56] References Cited
UNITED STATES PATENTS

| | | | |
|---|---|---|---|
| 2,606,960 | 8/1952 | Little | 317/235 |
| 2,853,662 | 9/1958 | Woods | 317/234 |
| 2,964,831 | 12/1960 | Peterson | 317/234X |
| 3,223,903 | 12/1965 | Salomon | 317/235 |
| 3,231,797 | 1/1966 | Koch | 317/235 |
| 3,300,646 | 1/1967 | Casebeer | 317/234X |
| 3,389,267 | 6/1968 | Aconsky | 317/234X |

*Primary Examiner*—James D. Kallam
*Attorneys*—Roger S. Borovoy and Alan H. MacPherson

ABSTRACT: Prior to packaging, support and interconnect leads are bonded to a semiconductor die containing light-sensitive components, enabling the photoresponse of each component to be tested. A plurality of similar semiconductor dice are then selected according to a desired photoresponse, and can be assembled into a package. The need for additional bonding with respect to the die is eliminated. Unwanted variations in photoresponse during the packaging process are prevented from occurring, and the similarity in photoresponse between components is maintained.

PATENTED FEB 2 1971 3,560,813

INVENTOR.

WILLIAM S. PHY

BY Roger S. Borovoy

Alan H. MacPherson

ATTORNEYS

HYBRIDIZED MONOLITHIC ARRAY PACKAGE

BACKGROUND OF THE INVENTION

1. Field of the Invention

This invention relates to a package and process whereby a plurality of light-sensitive semiconductor components are selected according to photoresponse, and subsequently assembled into a package without unwanted variations in photoresponse appearing between components.

2. Description of the Prior Art

It is difficult to fabricate a plurality of light-sensitive semiconductor components, such as photodiodes or phototransistors, so that they exhibit similar photoresponse. Although not all of the causes in variation in photoresponse are fully understood, it is believed that semiconductor assembly techniques, particularly bonding, create uneven stress along portions of the component surface. This stress, in turn, can cause substantial variations in photoresponse. For example, when leads are bonded to a semiconductor component, a wide variation often occurs in the magnitude and direction of the stress appearing along the component surface. If a protective encapsulant is placed over the component, additional stress can arise along the surface thereof as the encapsulant dries and shrinks. Furthermore, the magnitude and direction of stress can vary between components subject to the same type of bonding step. These factors make it difficult to control or even predict what the effect of photoresponse of each component will be.

Of the several prior art approaches for forming a photoarray having components with a similar photoresponse, none have been completely satisfactory. One technique comprises fabricating a plurality of components into a monolithic semiconductor substrate. Because of processing differences, even small ones, variation in photoresponse occur between components. Moreover, when an interconnection lead is bonded to either the backside or the top surface of the component substrate, or both, further photoresponse variations can occur. Once the photoresponse has changed, there is no satisfactory remedy. Each of the components is an integral part of the substrate, and therefore, cannot be separated according to photoresponse.

Another prior art approach comprises scribing a semiconductor wafer containing a plurality of light-sensitive components to obtain a plurality of individual dice. Those dice exhibiting a desired photoresponse are then individually placed on an attached to a support layer. Interconnect leads are bonded to each die. This latter step, however, may cause substantial variations to occur in the photoresponse of each die. Moreover, if the components are encapsulated with a sealing material to protect them from ambient and physical damage, the sealant can shrink as it hardens and create stress along the surface of the die, thereby causing still further variations in photoresponse.

Thus, there is a need for a package assembly wherein a plurality of semiconductor dice can be separated according to photoresponse, and those dice having a desired photoresponse assembled together into a package without variations in photoresponse occuring. Furthermore, the packaging selected should provide for protection from ambient and mechanical damage.

SUMMARY OF THE INVENTION

The structure of the invention is an improvement over the prior art because it allows the critical bonding steps that are performed directly on each of the light-sensitive components to be completed prior to final selection and assembly. After the critical bonding steps, the components are tested and those having a desired photoresponse are assembled into a special housing, which provides for protection from environmental contamination and physical damage while reducing the harmful effects of unwanted stress.

Briefly, the structure of the invention comprises a housing with one or more selected external surfaces and a plurality of cavities located within the housing. At least one of the cavities extends to a selected external surface of the housing. A pair of terminal leads of conductive material is located in at least this one cavity. The first of the pair of leads supports and is electrically connected to a semiconductor die attached thereto. The second lead of the pair is electrically isolated from the first lead. A portion of each extends through the housing to provide external contact. The semiconductor die has a principal light-sensitive surface, which is aligned so that light can be applied to this surface. An interconnect wire is coupled to another portion of the die and extends therefrom to the second lead to make electrical contact therewith. A portion of one wall of the housing extends into the cavity to provide support for the first lead. Also located within and filling the remainder of the cavity and covering the exposed portions of the die and leads is a protective layer of highly transparent encapsulant material, the protective layer extending to at least one selected external surface so as to render the latter substantially planar in shape.

Each of the remaining cavities of the plurality suitably extends to a selected external surface and contains a similar pair of leads with a semiconductor die having a desired photoresponse attached to the first lead and coupled to both leads.

DESCRIPTION OF THE PREFERRED EMBODIMENTS

Figure 1:
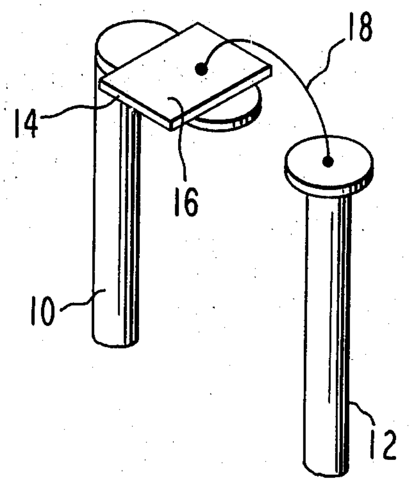
FIG. 1 is a simplified isometric drawing of a pair of terminal leads with the semiconductor die attached to the first lead of the pair.

Referring to FIG. 1, a pair of terminal leads 10 and 12 comprising a conductive material are provided. A semiconductor die 14, which has a principal light-sensitive surface 16, is located upon and attached to a portion of the first terminal lead 10 and makes electrical contact thereto. Preferably, a portion of the underside of the die 14 overhangs the support portion of lead 10 and remains uncovered. Die 14 is aligned so that light may be applied to its principal surface 16. A wire lead 18 is in electrical contact with a portion of the semiconductor die 14 and extends therefrom. Because terminal lead 10 and wire lead 18 are bonded to selected portions of the semiconductor die 14, no further bonding steps are necessary with respect to the die 14. Therefore, its photoresponse may now be tested, without the danger of unwanted variations occuring as a result of subsequent processing steps.

Figure 2:
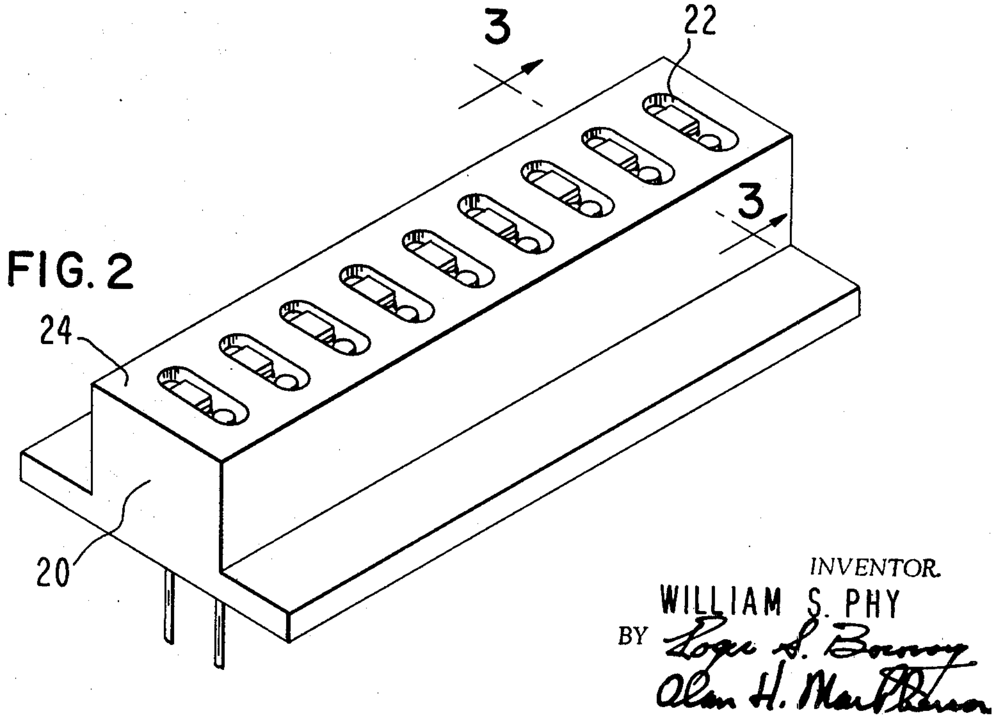
FIG. 2 is a simplified isometric drawing of the package of the invention.

Referring to FIG. 2, a housing 20 is formed so that a plurality of cavities 22 are located therein, each of the cavities 22 extending to a selected exterior surface 24 of the housing 20. Although FIG. 2 shows each of the cavities extending to the same exterior surface 24, it is within the scope of the invention to have the cavities extend to one of several selected exterior surfaces such as the side or bottom surfaces of housing 20. Preferably, housing 20 comprises a dielectric material, such as molded plastic.

Figure 3:
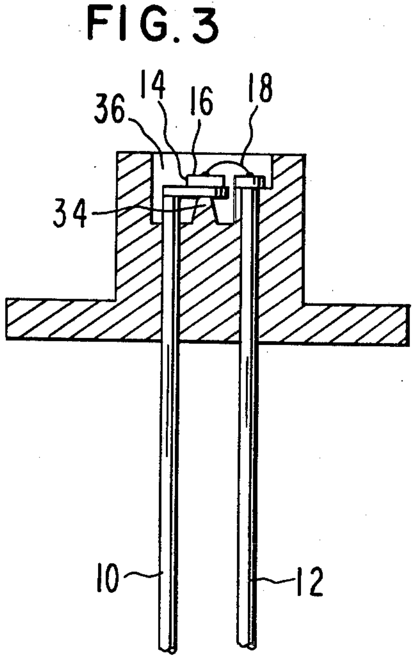
FIG. 3 is a simplified cross-sectional drawing of the package of FIG. 2 along the lines 3–3.

A pair of terminal leads 10 and 12 is inserted into each cavity and rests there in a manner indicated by FIG. 3, wherein the leads 10 and 12 are kept electrically isolated. A portion of each lead 10 and 12 extends from the cavity through the housing 20 to provide external contact. Suitably, a member 34 of the housing 20 extends from a wall of the cavity 22 to provide support for the first terminal lead 10. Inside the cavity, the semiconductor die 14 located upon the first lead 10 is aligned so that light can be applied to its principal surface 16, particularly light from an external source. Wire lead 18 extends over and makes electrical contact to the second terminal lead 12. A transparent dielectric protective material 36, preferably an encapsulant of a water-clear color, such as a clear thermosetting liquid acrylic, polyester or epoxy or a combination thereof, which upon curing presents a rigid, scratch- and solvent-resistant surface, fills the remaining portion of cavity 22 and surrounds the uncovered portions of leads 10 and 12 and the die 14. Encapsulant 36 extends to the surface 24 so as to render the latter substantially planar in shape.

Because encapsulant 36 surrounds the uncovered portions of leads 10 and 12 and die 14, any stress appearing at or along die 14 due to shrinking of the encapsulant 36 tends to be spherical rather than longitudinal. It has been found that spherical stress does not adversely affect photoresponse.

After the encapsulant 36 has been placed into the cavity and partially cured, a material having a hard and near optically perfect surface, such as a sheet of Mylar, is placed over the selected surface 24 and a weight placed thereupon for the remainder of the curing step. The Mylar sheet neither distorts nor adheres to the encapsulant material 36, while the latter replicates the surface of the Mylar. After the Mylar sheet is removed, the upper surface of the encapsulant 36 matches the selected housing surface 24, so that a nearly perfect planar shape is maintained.

Selection of the encapsulant material 36 should be such that it has approximately the same coefficient of expansion as the housing material 20. In some cases, a silicone coating may be placed over the die to provide a highly compliant surface, and thereby compensate for any mismatch between coefficients of expansion. After curing, even if bulk shrinkage of up to approximately three percent occurs in the encapsulant 36, the shear force resulting therefrom is not greater than the adhesive force between the encapsulant and the silicone coating over a wide temperature range, such as from −65 to 100° C.

The packaging method of the invention allows leads to be bonded to the semiconductor die before the latter is inserted into a housing. Because photoresponse of a semiconductor die normally does not vary after all the bonding steps have been performed on it, the dice may now be tested for photoresponse. Also, the die is placed in the cavity in such a manner that any stress appearing due to shrinkage of the encapsulant or to change in temperature is essentially spherical. In addition, the possibility of cracks appearing due to shear stress is greatly reduced.

While the package of the invention has been described with reference to a particular embodiment, once the principles are understood, it will be readily apparent to one skilled in the art that the idea may be applied to numerous other embodiments without departing from the scope of the invention.

I claim:

1. A hybridized monolithic array package comprising:
- a housing having a plurality of cavities located therein and at least one selected external surface, each of the cavities extending to a selected external surface;
- first and second terminal leads of conductive material located in each of said cavities, the second lead electrically insulated from the first lead, a portion of each lead extending through the housing for providing external contact;
- a semiconductor die located within each cavity and supported by and making electrical contact to the first lead, the die being aligned for receiving light on a light-sensitive surface thereof;
- means for making electrical connection between another portion of the die and the second lead; and
- a protective layer of highly transparent electrically insulating material located within and filling the remainder of the cavities, surrounding the die and exposed portions of the die and leads, and extending to the selected external surface, whereby the surface is rendered substantially planar in shape.

2. The package recited in claim 1 wherein the connection means comprises a conductive wire extending from the die to the second lead and electrically connected to both.

3. The package recited in claim 1 further defined by a member extending from a wall of each cavity to support the first lead.

4. The package recited in claim 1 wherein the housing comprises a dielectric material.

5. The package recited in claim 4 wherein the housing comprises molded plastic.

6. The structure recited in claim 1 wherein the die is bonded to the first lead.

7. The structure recited in claim 1 wherein the protective layer comprises a thermosetting liquid encapsulant cured into a rigid, scratch- and solvent-resistant surface.

8. The structure as defined in claim 6 wherein the encapsulant is selected from a group consisting of a clear thermosetting liquid acrylic, polyester, epoxy, or a combination thereof.

9. In a method of assembling a plurality of semiconductor dice into a package, the steps comprising:
- bonding each die to the first terminal lead in a corresponding pair of terminal leads of conductive material, a separate pair of terminal leads existing for each die, whereby the first lead supports the bonded die and makes electrical contact to a portion thereof;
- bonding a portion of a corresponding conductive wire to another portion of each die so that electrical contact is made thereto, a separate conductive wire existing for each die;
- testing each die via the respective first lead and wire for a desired photoresponse;
- inserting each pair of terminal leads to which is attached a die yielding the desired photoresponse into a corresponding one of a plurality of cavities located within a housing the first lead in each pair of terminal leads supporting a die having the desired photoresponse, each cavity extending to a selected external surface of the housing and formed so that terminal leads placed therein are kept electrically isolated, each terminal lead extending through the housing, each die being aligned so that light can be applied to a principal light-sensitive surface of the die;
- bonding another portion of each conductive wire to the second lead of the corresponding terminal lead pair so that electrical contact is made thereto; and
- filling each cavity with a transparent encapsulant that surrounds exposed portions of each die and its corresponding pair of terminal leads, the encapsulant extending to at least one selected external surface to render the latter substantially planar in shape.

10. The process recited in claim 9 wherein a plurality of light-sensitive dice are inserted into a respective plurality of cavities located within the housing, one die for each cavity, thereby forming a photoarray package comprising components having a desired photoresponse.